(12) United States Patent
Lee et al.

(10) Patent No.: US 6,235,116 B1
(45) Date of Patent: May 22, 2001

(54) METHOD AND APPARATUS FOR GROWING LAYER ON ONE SURFACE OF WAFER

(75) Inventors: Ming-Kwei Lee; Hsin-Chih Liao, both of Hsinchu (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/247,822

(22) Filed: Feb. 11, 1999

(30) Foreign Application Priority Data

Oct. 13, 1998 (TW) .................................................. 87116988

(51) Int. Cl.$^7$ ........................................................ B05C 3/02

(52) U.S. Cl. ............................................ 118/415; 118/412

(58) Field of Search ................................... 118/411, 412, 118/415; 438/500, 925, 763

(56) References Cited

U.S. PATENT DOCUMENTS

| | | | |
|---|---|---|---|
| 3,747,562 | * | 7/1973 | Stone et al. . |
| 3,890,194 | * | 6/1975 | Ettenberg . |
| 4,033,291 | * | 7/1977 | Naito et al. . |
| 4,149,914 | * | 4/1979 | Weyrich et al. . |
| 4,357,897 | * | 11/1982 | Leswin . |

* cited by examiner

Primary Examiner—Brenda A. Lamb

(57) ABSTRACT

A method and an apparatus for growing a layer on one surface of a wafer by liquid phase deposition are provided. At first, a first wafer is putted on a first wafer-holder by its first surface. Then, a growth-liquid vessel having a first opening at the bottom is mounted on the first wafer-holder. Thereafter, a growth liquid is poured into the growth-liquid vessel to expose a second surface of the first wafer to the growth liquid for growing the layer on the second surface of the first wafer. Then, the first wafer is taken out from the first wafer-holder to obtain a wafer with a layer grown only on one surface.

13 Claims, 4 Drawing Sheets

METHOD AND APPARATUS FOR GROWING LAYER ON ONE SURFACE OF WAFER

FIELD OF THE INVENTION

The present invention relates to a method and an apparatus for growing a layer on one surface of a wafer, and especially to a method and an apparatus for growing a layer on one surface of a wafer by liquid phase deposition.

BACKGROUND OF THE INVENTION

In the field of manufacturing integrated circuit (IC) and semiconductor device, the technique of forming a layer on a wafer is very important. The layer can be used as a gate oxide layer of metal-oxide-semiconductor (MOS), a field oxide layer for trench-isolating other devices, a mask for ion implantation and diffusion, a capping layer for preventing dopants from diffusing out, or a passivation layer for protecting a device from being scratched by dirt. There are many methods for growing a layer on the wafer, e.g. thermal oxidation, chemical vapor deposition (CVD), plasma enhanced chemical vapor deposition (PECVD), and electron cyclotron resonance chemical vapor deposition (ECRCVD). Both of the gate oxide and field oxide have to be made by the thermal oxidation because only the thermal oxidation can provide a oxide layer with a low interface trap density. However, technologically speaking, every method has its own limitation in usage. For the thermal oxidation, the required high temperature (700~1200° C.) will easily deform the chip and destroy the structure (because of the redistribution of the dopants). The main drawbacks of the CVD method are the expensive equipment and the requirement of precisely-controlled temperature for forming a layer. As for other methods, they need not only the expensive equipment but a growing temperature over 300° C. and are also more complex.

The liquid phase deposition (LPD) method is a new method for growing oxide layers. The growing temperature of this method is low (about 40° C.) and the equipment is relatively cheap. Therefore, the LPD method is very useful for manufacturing the integrated circuit and the semiconductor device. However, no specific technique or process is needed for producing a great number of wafers, each of which has a LPD layer thereon. Like other methods, the LPD method has a problem that the layer will grow on both surfaces of a wafer. The process of etching the LPD layer on the back of a wafer is necessary after the layer is grown. If there is an apparatus and a method that can control the growth of the LPD layer only on one surface of a wafer, the cost and time of growing LPD layer on the back will be saved, and the process of etching the LPD layer on the back, of course, will be needless.

Therefore, the present invention provides a method and an apparatus for growing a layer on one surface of a wafer by the LPD method. The apparatus of the present invention is low-cost and the method of the present invention is relatively simple and effective. The present invention makes the LPD method more useful.

SUMMARY OF THE INVENTION

An object of the present invention is to provide a method for growing a layer on one surface of a wafer by the LPD method. At first, a first wafer is putted on a first wafer-holder by its first surface. Then, a growth-liquid vessel having a first opening at the bottom is mounted on the first wafer-holder by the first opening so that the first wafer on the first wafer-holder is in contact with the growth-liquid vessel. Thereafter, a growth liquid is poured into the growth-liquid vessel to expose a second surface of the first wafer to the growth liquid for growing the layer on the second surface of the first wafer. Then, the first wafer is taken out from the first wafer-holder to obtain a wafer with a layer grown only on one surface. Therefore, this method can save a lot of money and time without etching the LPD layer on the back. This method is very effective.

Before the first opening of the growth-liquid vessel is mounted on the first wafer-holder, the method further includes a step of putting a first O-ring on the first wafer on the first wafer-holder. The O-ring can ensure that the first opening is well sealed with the first wafer-holder and no liquid will flow out. The O-ring has a diameter a little larger than that of the first opening and has a shape similar to that of the first wafer.

Preferably, after the growth liquid is poured into the growth-liquid vessel, the method further includes the steps of putting a second wafer on a second wafer-holder by its first surface and mounting the second wafer-holder on a second opening at the top of the growth-liquid vessel. The second wafer on the second wafer-holder is in contact with the growth-liquid vessel. Because the second wafer and the second wafer-holder are provided, the step of taking out the first wafer further includes more steps. At first, the growth-liquid vessel is inverted to let the first opening at the top thereof and the second opening at the bottom thereof to expose a second surface of the second wafer to the growth liquid. Then, the first wafer-holder is removed from the first opening of the growth-liquid vessel and the first wafer is removed from the first wafer-holder.

The method of the present invention can also be used to produce a plurality of wafers, each of which has a layer on one surface. A plurality of wafers are putted on the first and second wafer-holders with a space between each other to ensure that layers can be grown freely on the wafers. A plurality of growth-liquid vessels are mounted between them and each wafer is in contact with a corresponding growth-liquid vessel.

Another object of the present invention is to provide an apparatus for growing a layer on one surface of a wafer by the LPD method. The apparatus includes a growth-liquid vessel having a first opening at the bottom thereof for containing a growth liquid therein and a first wafer-holder for putting thereon a first wafer by a first surface. The first opening of the growth-liquid vessel is mounted on the first wafer-holder and the first wafer is in contact with the growth-liquid vessel so that a second surface of the first wafer is exposed to the growth liquid for growing the layer on the second surface of the first wafers. The combination of the growth-liquid vessel and the wafer-holder has a smaller volume and this apparatus is relatively simple and cheap.

According to the present invention, both of the growth-liquid vessel and the first wafer-holder are made of an anti-corrosive material. The anti-corrosive material is preferably polybutafluoroethylene (TEFLON) or polyethylene (PE).

The apparatus further includes a second wafer-holder mounted on a second opening of the growth-liquid vessel. The apparatus of the present invention can also be used to produce a plurality of wafers, each of which has a layer on one surface.

The present invention may best be understood through the following description with reference to the accompanying drawings, in which:

DETAILED DESCRIPTION OF THE PREFERRED EMBODIMENTS

Figure 1:
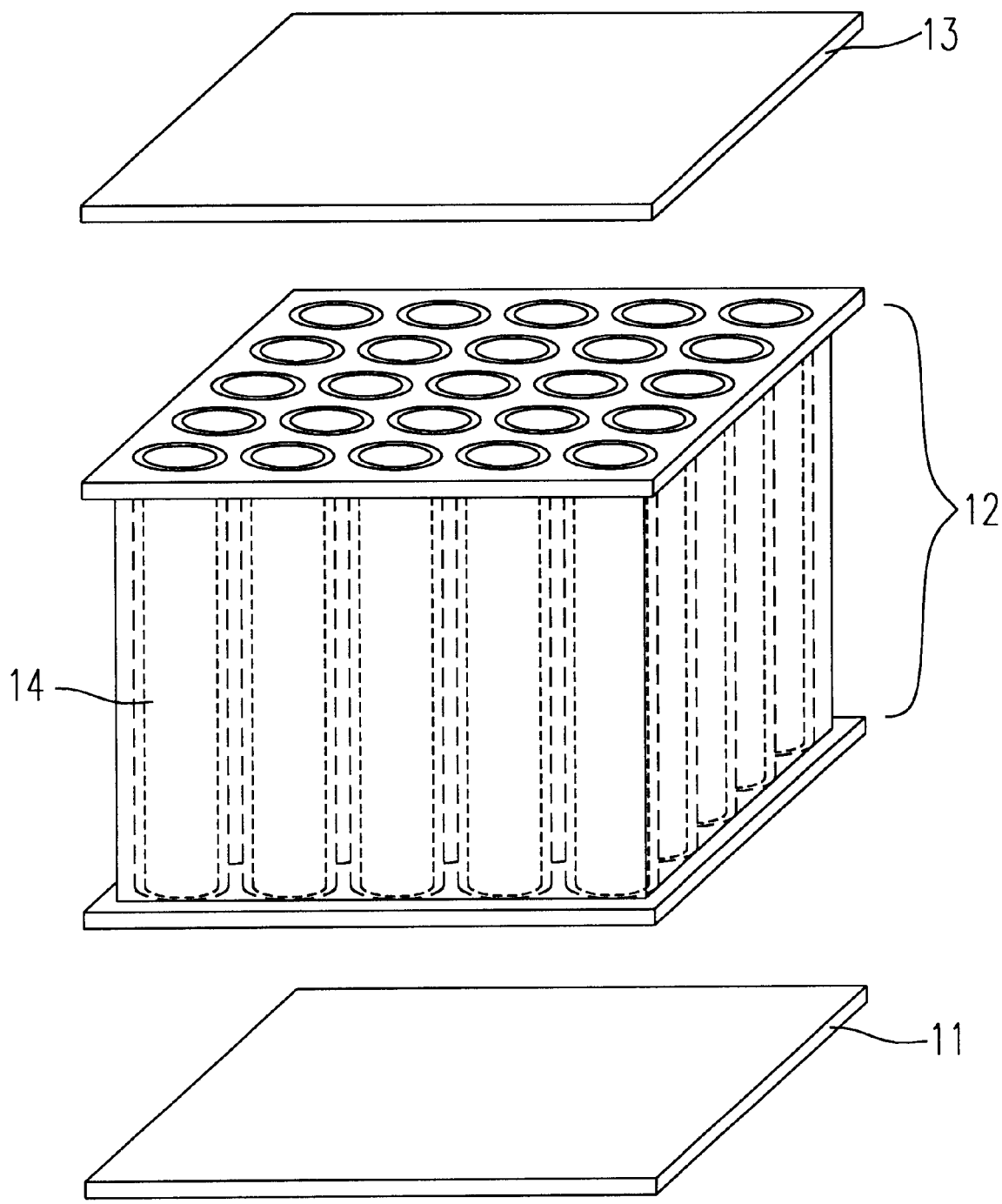
FIG. 1 is a schematic diagram showing the apparatus of the present invention.
Figure 4:
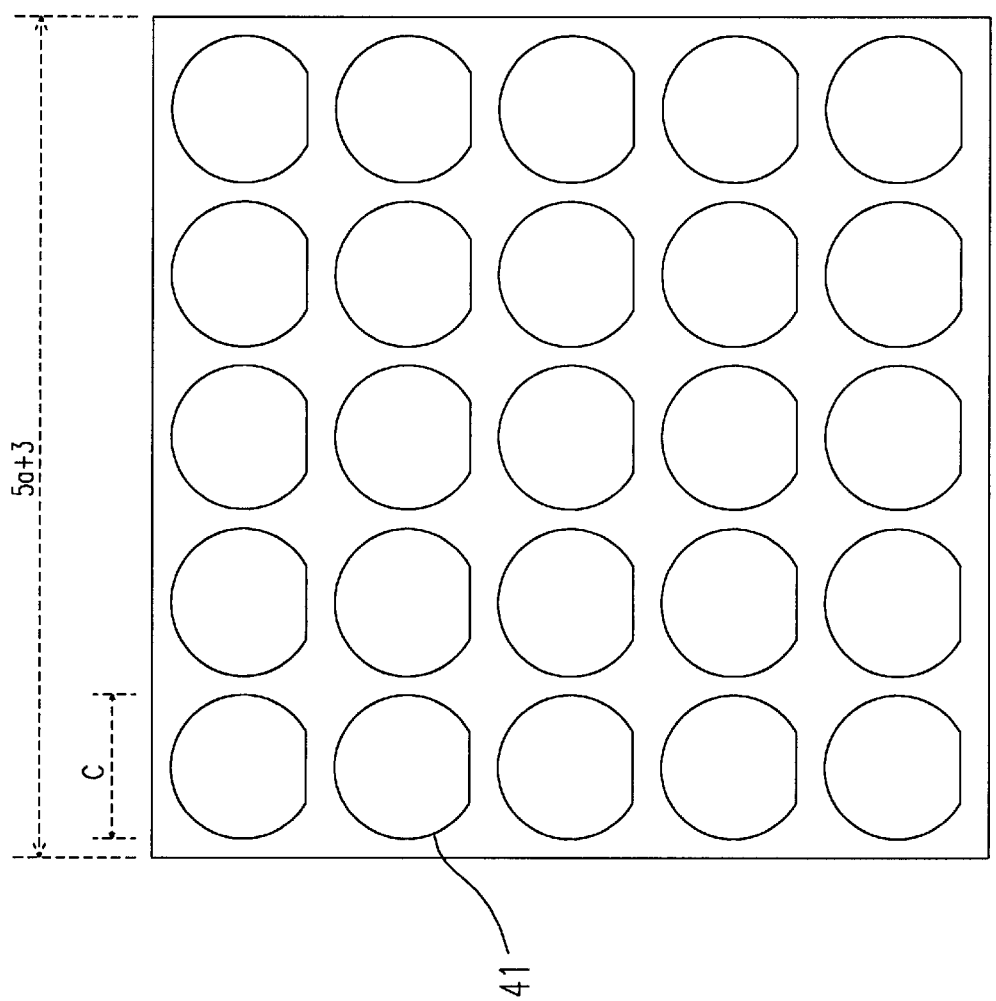
FIG. 4 is a schematic diagram showing the placement of wafers on a wafer-holder according to the present invention.

Please refer to FIG. 1 showing the preferred embodiment of an apparatus of the present invention. The apparatus is assembled by three different parts. The first part 11 is the first wafer-holder 11, the second part 12 has a plurality of growth-liquid vessels 14, and the third part 13 is the second wafer-holder 13. The first and second wafer holders 11, 13 are used to put wafers 41 thereon as shown in FIG. 4. Every growth-liquid vessel has a first opening at the bottom and a second opening at the top. The first wafer-holder 11 is mounted on the first openings of the growth-liquid vessels 41 and the second wafer-holder 13 is mounted on the second openings of the growth-liquid vessels 41. Each wafer on the wafer-holders 11, 13 has a diameter larger than that of the opening of each growth-liquid vessel. Therefore, the central part of the wafer will be contained in the growth-liquid vessel and the border of the wafer will be not contained therein. After a growth liquid is poured into the growth-liquid vessels, the central part of the wafer will be exposed to the growth liquid. The growth liquid usually has the composition of silicon dioxide ($SiO_2$) or titanium dioxide ($TiO_2$). When the wafers 41 are exposed to the growth liquid for a short time, a $SiO_2$ or $TiO_2$ layer will be grown on their surfaces.

Figure 2:
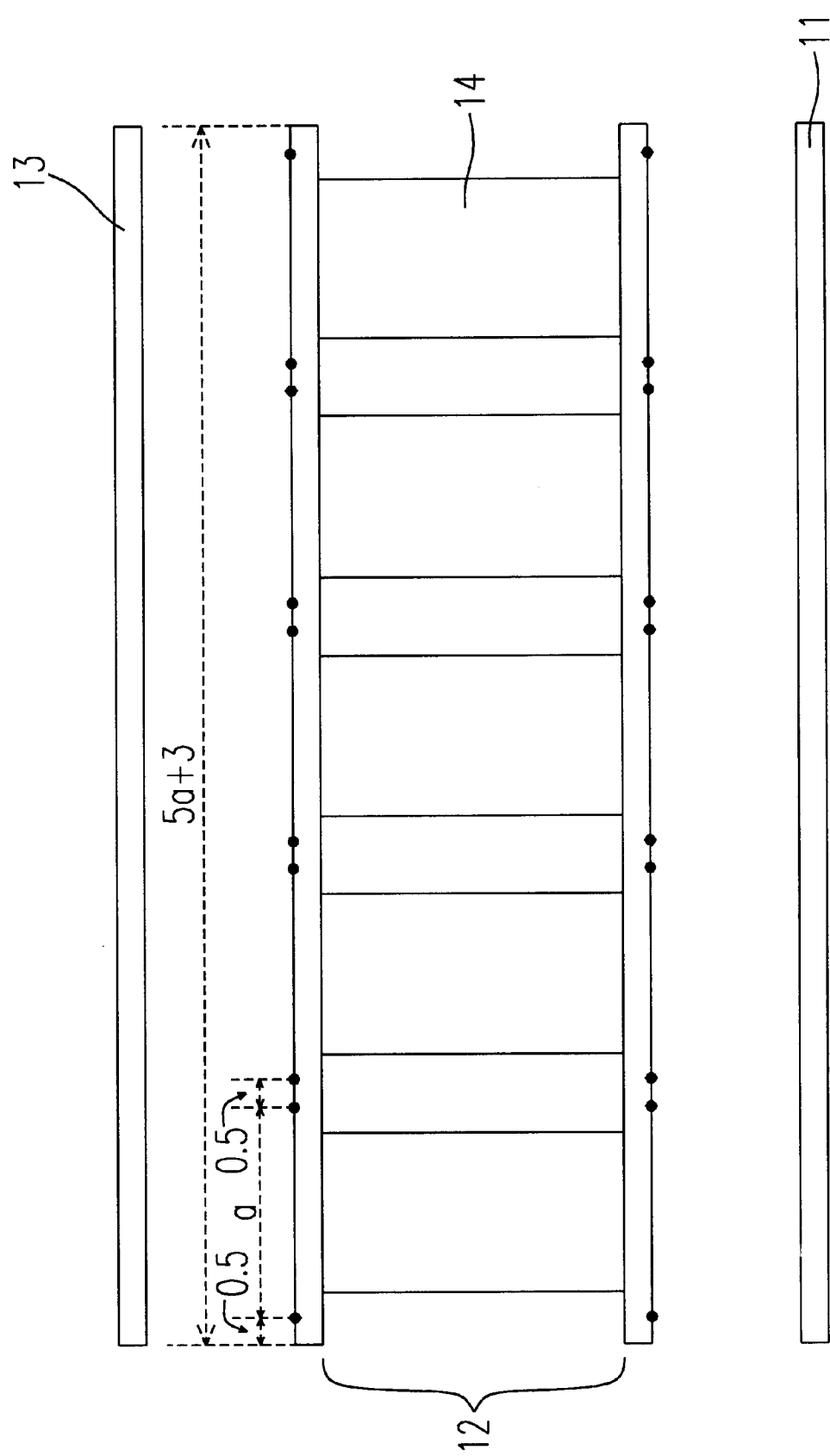
FIG. 2 is a side view of the apparatus of the present invention.
Figure 3:
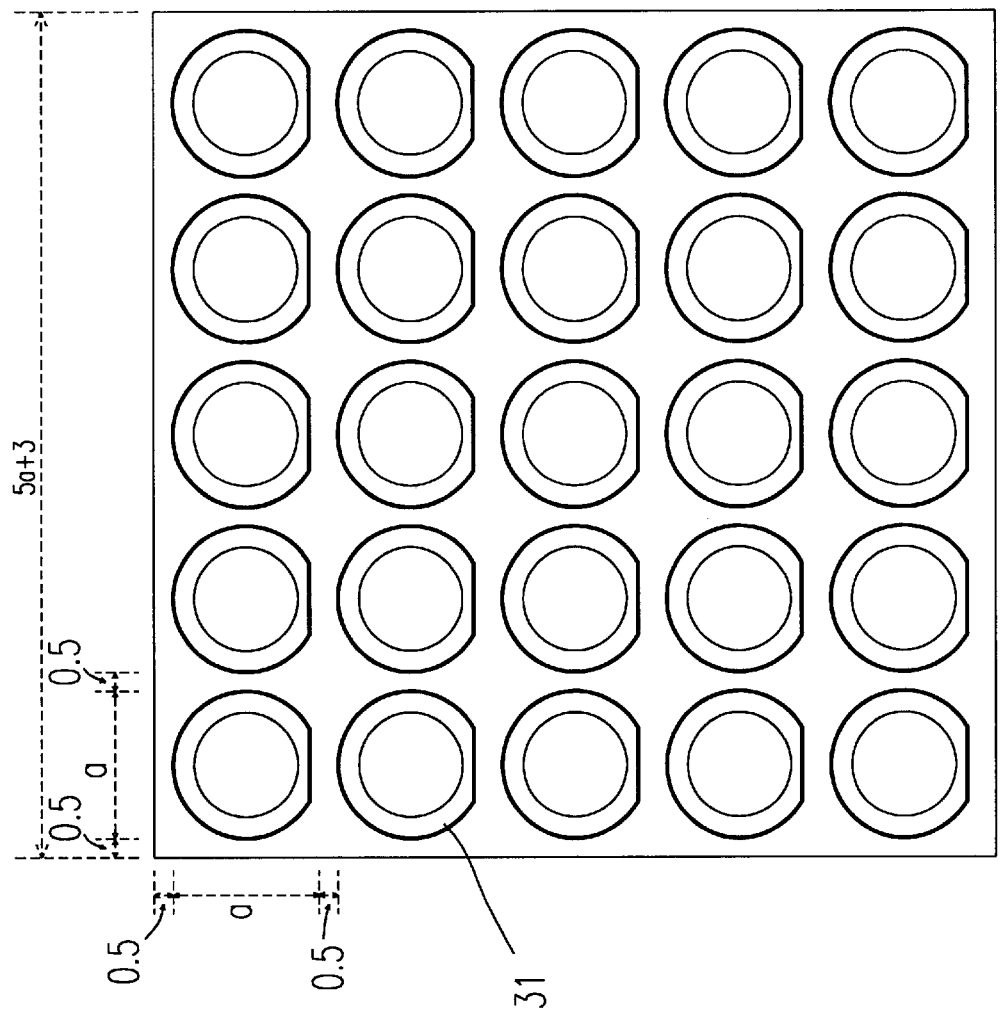
FIG. 3 is a top view of the apparatus of the present invention.

As shown in FIGS. 2~4, the apparatus further includes a plurality of O-rings 31 mounted between the wafers on the wafer-holders 11, 13 and the growth-liquid vessel 14 for preventing the growth liquid from leaking out. Every O-ring 31 has a diameter larger than that of the openings of the growth-liquid vessels 14 and smaller than that of the wafers 41. In addition, there is a space between the wafers to ensure that layers can be grown freely on the wafers. If the diameter of the O-ring is $\alpha$ and the space is 0.5 cm, for a wafer-holder having thereon 5×5 wafers, the length of the wafer-holder will be 5×$\alpha$cm+6×0.5 cm (the number of the spaces are six) =5 $\alpha$+3 cm. Moreover, if the diameter of the wafer c is $\alpha$+0.4 cm, the space between the wafers will be 0.3 cm. For example, 1. If the diameter of the wafer is 12.7 cm (5 inches), the length of the 5×5 wafer-holder will be 5×12.3 cm +3 cm=64.5 cm. The area of this equipment will be 64.5 cm×64.5 cm=4160.25 $cm^2$.
2. If the diameter of the wafer is 20.32 cm (8 inches), the length of the 5×5 wafer-holder will be 5×19.92 cm+3 cm=102.6 cm. The area of this equipment will be 102.6 cm×102.6 cm=10526.76 $cm^2$.
3. If the diameter of the wafer is 30.48 cm (12 inches), the length of the 5×5 wafer-holder will be 5×30.08 cm +3 cm=153.4 cm. The area of this equipment will be 153.4 cm×153.4 cm=23531.56 $cm^2$.

The method of the present invention is to grow a layer on one surface of a wafer by liquid phase deposition. Both of the first and second wafer-holders 11, 13 have a plurality of positions for putting thereon a plurality of wafers 41 and the number of the growth-liquid vessels 14 is the same as that of the wafers 41. First of all, a first plurality of wafers 41 are putted on the first wafer-holder 11 by their first surfaces. Then, a plurality of growth-liquid vessels 14 are mounted on the first wafer-holder 11. Each wafer 41 is in contact with a corresponding growth-liquid vessels 14 and the central part of each wafer is contained therein. Thereafter, the growth liquid is poured into the growth-liquid vessels 14. Because the wafers 41 are on the bottom of the growth-liquid vessels 14, the second surfaces of the wafers 41 are exposed to the growth-liquid. After a while, layers will be grown on the second surfaces of the wafers 41 by liquid phase deposition.

Then, a second plurality of wafers 41 are putted on the second wafer-holder 13 by their first surfaces. Similarly, the second wafer-holder 13 is mounted on the growth-liquid vessels 14. Each wafer 41 is in contact with a corresponding growth-liquid vessels 14 and the central part of each wafer is contained therein. Thereafter, the whole apparatus is inverted to let the second wafer-holder 13 at the bottom and the first wafer-holder 11 at the top. Because the second wafer-holder 13 is at the bottom of the growth-liquid vessel 14, the second surface of the central part of the second plurality of wafers 41 will be exposed to the growth liquid. After a while, a layer will be grown on the second surface of the central part of the second wafer 41 by liquid phase deposition.

Thereafter, the first wafer-holder 11 is removed from the growth-liquid vessels 14. Every wafer 41 removed from the first wafer-holder 14 has a layer on one surface of them.

To continuously produce a great number of wafers 41 having a layer on one surface of each wafer, more wafer-holders can be mounted on the growth-liquid vessels. For example, a third wafer-holder is mounted on the growth-liquid vessels and the second wafer-holder is removed from the growth-liquid vessel after the whole apparatus is inverted. A fourth wafer-holder is mounted on the growth-liquid vessels and the third wafer-holder is removed from the growth-liquid vessel after the whole apparatus is inverted, and go on.

Preferably, O-rings 31 are mounted between the wafers 41 and the growth-liquid vessels 14 before the wafer-holders and the growth-liquid vessels 14 are mounted. The O-rings 31 can prevent the growth liquid from leaking out.

Moreover, the growth-liquid vessels and the wafer-holders are made of an anti-corrosive material, such as polybutafluoroethylene (TEFLON) and polyethylene (PE).

Generally speaking, the characteristics of the present invention are as follows.

1. The output of the apparatus of the present invention can changed according to the demand of the manufacturer. The embodiment of the present invention is a ×5 wafer-holder. It means that twenty-five wafers having a layer on one surface of each wafer can be provided individually. If more wafers are putted on the wafer-holder, more wafers having a layer on one surface can be provided once.
2. The method and the apparatus of the present invention can effectively minimize the time for producing the wafers having a layer on one surface individually. The manufacture of the wafers is continuous and convenient. Because the wafers are exposed to the growth liquid by inverting the growth-liquid vessels, the layers can grow on the wafers directly and the wafers having a layer on one surface individually can be removed continuously.
3. The whole apparatus of the present invention is low-cost. The anti-corrosive materials of the wafer-holder and the growth-liquid vessel are usually TEFLON and PE. These materials are very cheap. The shape of the apparatus is also simple and can be constructed easily.

4. The size of the whole apparatus is relatively small. The space of the factory can be used more effectively.
5. This method can make the wafer grow a layer only on one surface. Therefore, the process of etching a LPD layer on the back will be saved.

This is a very important improvement. A lot of time and money is saved consequently.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An apparatus for growing a layer on one surface of a wafer by liquid phase deposition, comprising:
    a growth-liquid vessel having a first opening at a bottom thereof for containing a growth liquid therein; and
    a first wafer-holder for putting thereon a first wafer by a first surface, wherein said first opening of said growth-liquid vessel is mounted on said first wafer-holder and said first wafer is in contact with said growth-liquid vessel so that a second surface of said first wafer is exposed to said growth liquid for growing said layer on said second surface of said first wafer, and
    a second wafer-holder mounted on a second opening at the top of said growth-liquid vessel for putting a second wafer by a first surface, wherein said second wafer is in contact with said growth-liquid vessel so that a second surface of said second wafer is exposed to said growth liquid for growing said layer on said second surface of said second wafer.

2. The apparatus according to claim 1, wherein said growth-liquid vessel and said first wafer-holder are made of an anti-corrosive material.

3. The apparatus according to claim 2, wherein said anti-corrosive material is polybutafluoroethylene (TEFLON).

4. The apparatus according to claim 2, wherein said anti-corrosive material is polyethylene (PE).

5. The apparatus according to claim 1, wherein said apparatus further comprises a second O-ring mounted between said second wafer and said growth-liquid vessel for preventing said growth liquid from leaking out.

6. The apparatus according to claim 5, wherein said second O-ring has a diameter larger than that of said second opening and has a shape similar to that of said second wafer.

7. The apparatus according to claim 1, wherein said layer is a silicon dioxide ($SiO_2$) layer.

8. An apparatus for growing a layer on one surface of a wafer by liquid phase deposition, comprising:
    a growth-liquid vessel having a first opening at a bottom thereof for containing a growth liquid therein; and
    a first wafer-holder for putting thereon a first wafer by a first surface, wherein said first opening of said growth-liquid vessel is mounted on said first wafer-holder and said first wafer is in contact with said growth-liquid vessel so that a second surface of said first wafer is exposed to said growth liquid for growing said laver on said second surface of said first wafer, wherein said apparatus further comprises a first O-ring mounted between said first wafer and said growth-liquid vessel for preventing said growth liquid from leaking out.

9. The apparatus according to claim 8, wherein said first O-ring has a diameter larger than that of said first opening and has a shape similar to that of said first wafer.

10. An apparatus for growing a layer on one surface of a wafer by liquid phase deposition, comprising:
    a plurality of growth-liquid vessels, each of which has a first opening at the bottom thereof for containing a growth liquid therein; and
    a first wafer-holder for putting thereon a first plurality of wafers by first surfaces wherein said first openings of said growth-liquid vessels are mounted on said first wafer-holder and each of said first plurality of wafers is in contact with each of said plurality of growth-liquid vessels so that a second surface of each of said first wafers is exposed to said growth liquid for growing said layer on said second surface of each of said first wafers.

11. The apparatus according to claim 10, wherein said apparatus further comprises a first plurality of O-rings mounted between said first wafers and said plurality of growth-liquid vessels for preventing said growth liquid from leaking out.

12. The apparatus according to claim 10, wherein said apparatus further comprises a second wafer holder for putting thereon a second plurality of wafers by first surfaces wherein second openings of said growth-liquid vessels are mounted on said second wafer-holder and each of said second plurality of wafers is in contact with each of said plurality of growth-liquid vessels so that a second surface of each of said second wafers is exposed to said growth liquid for growing said layer on said second surface of each of said second wafers.

13. The apparatus according to claim 12, wherein said apparatus further comprises a second plurality of O-rings mounted between said second wafers and said plurality of growth-liquid vessels for preventing said growth liquid from leaking out.

* * * * *